(12) United States Patent
Kawai et al.

(10) Patent No.: US 7,616,121 B2
(45) Date of Patent: Nov. 10, 2009

(54) METHOD FOR ATTACHING IC TAG, ARTICLE WITH IC TAG ATTACHED, AND IC TAG

(75) Inventors: Wakahiro Kawai, Kyoto (JP); Yukio Nakao, Kobe (JP)

(73) Assignees: Omron Corporation, Kyoto (JP); Sumitomo Rubber Industries, Ltd., Hyogo (JP)

( * ) Notice: Subject to any disclaimer, the term of this patent is extended or adjusted under 35 U.S.C. 154(b) by 432 days.

(21) Appl. No.: 11/587,308

(22) PCT Filed: Apr. 26, 2005

(86) PCT No.: PCT/JP2005/007927

§ 371 (c)(1),
(2), (4) Date: Oct. 23, 2006

(87) PCT Pub. No.: WO2005/104019

PCT Pub. Date: Nov. 3, 2005

(65) Prior Publication Data

US 2008/0020516 A1    Jan. 24, 2008

(30) Foreign Application Priority Data

Apr. 27, 2007    (JP) .............................. 2004-131579

(51) Int. Cl.
*G08B 13/14*    (2006.01)
(52) U.S. Cl. ................................. 340/572.8; 340/572.1
(58) Field of Classification Search .............. 340/572.8, 340/442
See application file for complete search history.

(56) References Cited

U.S. PATENT DOCUMENTS

| 6,001,459 | A | * | 12/1999 | Mahn, Jr. | .................... | 428/32.8 |
| 6,580,363 | B1 | | 6/2003 | Wilson | | |
| 7,338,914 | B2 | * | 3/2008 | Conwell et al. | ............. | 442/149 |
| 2004/0182494 | A1 | * | 9/2004 | Dominak et al. | ......... | 156/110.1 |
| 2005/0059308 | A1 | * | 3/2005 | Parsons | ...................... | 442/149 |

FOREIGN PATENT DOCUMENTS

| JP | 2-133907 U | 11/1990 |
| JP | 7-266811 A | 10/1995 |
| JP | 11-102424 A | 4/1999 |
| JP | 2000-84681 A | 3/2000 |
| JP | 2002-209343 | 7/2002 |
| JP | 2004-13449 A | 1/2004 |
| JP | 2004-501833 A | 1/2004 |

* cited by examiner

*Primary Examiner*—Toan N Pham
*Assistant Examiner*—Kerri McNally
(74) *Attorney, Agent, or Firm*—Dickstein Shapiro LLP

(57) ABSTRACT

The present invention provides a method for attaching an IC tag. In the method, an IC tag performing wireless communication using an electronic component appropriately disposed is attached to an article made from an elastically deformable material. Specifically, the IC tag is attached to a predetermined portion of the article, exclusive of a disposition section where the electronic component is disposed. The invention provides (i) an IC tag which is not damaged even when attached to an article made from an elastically deformable material, such as a tire used under extreme environment, (ii) a method for attaching the IC tag, and (iii) an article with the IC tag attached.

10 Claims, 14 Drawing Sheets

24···BASE       26···IC
25···SUBSTRATE  27···ANTENNA

24 ··· BASE        26 ··· IC
25 ··· SUBSTRATE   27 ··· ANTENNA

7 ⋯ COVER LAYER

7 ··· COVER LAYER

7 ⋯ COVER LAYER  
8 ⋯ PROTRUDING SURFACE  
7 0 ⋯ TIRE  
7 4 ⋯ INNER LINER

50 ··· IC TAG  74 ··· INNER LINER
70 ··· TIRE   80 ··· TIRE WITH IC TAG ATTACHED
75' ··· BEAD APEX

50 ··· IC TAG    74 ··· INNER LINER
70 ··· TIRE     80 ··· TIRE WITH IC TAG ATTACHED

25···SUBSTRATE   26···IC   27···ANTENNA

29 ··· BONDING ADHESIVE    70 ··· TIRE
50 ··· IC TAG             74 ··· INNER LINER

METHOD FOR ATTACHING IC TAG, ARTICLE WITH IC TAG ATTACHED, AND IC TAG

TECHNICAL FIELD

The present invention relates to (i) a method for attaching an IC tag to an article, such as a tire, which is made from an elastically deformable material, (ii) an article with an IC tag attached, and (iii) an IC tag.

BACKGROUND ART

For tires used in vehicles such as, for example, automobiles, it is required to obtain inherent information of each tire immediately to control management of tires such as manufacturing, shipment, distribution, and maintenance etc. Such inherent information includes types, production numbers, specifications, properties, production histories, use histories, and/or the like.

According to the production liability low (PL law) particularly, in a case where a defected article leads to damage on a human body or infringement of property, manufactures have a responsibility of compensating the loss caused by the defected article, regardless whether or not the damage is caused by their fault. Thus, it is indispensable for manufactures to manage their tires individually.

Further, U.S. department of transportation (DOT) obliges the manufactures to identify, as information for warranty of each tire, a production number and a vehicle identification number (VIN) so as to enable identification and management of a tire individually.

Method for adding such inherent information to a tire have been proposed. One such conventional method is to attach a sticker of a bar code system to a surface or inner surface of a tire (see Japanese Unexamined Patent Publication 266811/1995 (Tokukaihei 7-266811)). The other conventional method is to mark an identification code on a surface of a tire (see Japanese Unexamined Patent Publication 084681/2000 (Tokukai 2000-084681)).

The methods using the bar code system or marking, however, suffer from problems that the amount of information is limited due to a display area, and that the information attached or marked cannot be identified since it fades away through exfoliation, abrasion, and/or the like. Particularly, in the bar code system, the surface of a tire is contaminated under extreme use environment, so that the information cannot be read out. To address the problem, there has been a measure that a bar code sticker is attached inside a tire. In this case, however, information attached in the bar code sticker cannot be used after the tire is mounted to a vehicle.

To solve the problems of the conventional methods, consideration is made to a method which uses a non-contact IC tag (hereinafter referred to as RFID tag). An RFID tag can store large amount of information in an IC. Further, an RFID tag can be externally read out with a distance of several centimeters to several meters. This enables information stored in a tag to be easily read out even when the tag is attached inside a tire.

However, a process for manufacturing a tire includes steps such as a vulcanization step during which a tire is required to be under high temperature and pressure loads.

Further, a tire may be bended and/or stretched to be deformed when it is used, or a tire may have a high temperature by being in friction with a load surface or by other factors. Such a situation may cause an RFID tag (i) to be under extreme environment such as a high temperature and a high pressure when the IC tag is attached inside a tire, or (ii) to be deformed by being bended and stretched repeatedly when a tire is used. This gives rise to a problem of breaking an IC or a coil which constitutes an RFID tag, or breaking bonding points at which the components are connected to each other.

To prevent such breakage of an RFID tag, a common method has been proposed in which an RIFD tag is bonded to an inner surface of a tire (see Japanese Unexamined Patent Publication 013449/2004 (Tokukai 2004-013449)).

Similarly, to prevent the breakage of an RFID tag, another method has been proposed. In the method, as shown in a side cross sectional view of FIG. 14(a), an IC section 123 of a non-contact IC tag 124 is sealed with a resin such as epoxy 121. Further, the method employs wires 122 which are made of copper having a thickness of about ϕ0.1 mm, and which are relatively stiff to bending of a coil.

However, the above methods suffer from the following problem. As shown in FIG. 14(b), if a bonding layer 126 or the like is tightly attached to a tire 127, i.e., an elastic rubber member, the flexibility of the non-contact IC tag 124 is interfered. This causes cracking inside a tire due to a difference in deformation capability between the non-contact IC tag 124 and the tire 127, resulting in degrading the safety of the tire.

Further, the above methods suffer from the problems of (i) breaking the hard epoxy 121 because the elastic deformation capability of the epoxy 121 cannot follow that of the tire 127, causing breakage of the internal IC section 123 rather easily, and (ii) increasing the number of steps for manufacturing a non-contact IC tag, resulting in a cost increase of the non-contact IC tag.

DISCLOSURE OF INVENTION

In view of the foregoing problems, the present invention has an object to provide (i) an IC tag which is not broken even when attached to an article made from an elastically deformable material, such as a tire used under extreme environment, (ii) a method for attaching the IC tag, and (iii) an article with the IC tag attached.

According to the present invention, there is provided a method for attaching an IC tag, the method including the step of attaching an IC tag to an article made from an elastically deformable material, the IC tag performing wireless communication using an electronic component appropriately disposed, the IC tag being attached to a predetermined portion of the article, exclusive of a disposition section where the electronic component is disposed.

Examples of the electronic component include component(s) constituting an IC tag, such as an antenna and/or an IC (Integrated Circuit).

Examples of the elastically deformable material include materials having elastic deformation properties such as rubber materials, for example, a SBR (styrene-butadiene rubber), NBR (acrylonitrile-butadiene rubber), ethylene propylene rubber, silicone rubber, butadiene, polyisoprene (natural rubber), and the like.

As the article, an article made from a material having elastic deformation properties is used. Examples of the article include (i) tires used in a four-wheeled vehicle, a two-wheeled vehicle, a bicycle, and the like, and (ii) rubber balls used in ball sports.

It is preferable that the IC tag be a tag including an IC and an antenna. Examples of the tag include non-contact thin IC labels using a communication frequency of 13.56 MHz, and non-contact thin IC labels using a UHF band (850 MHz to 960 MHz) as a communication frequency.

The predetermined portion of the label, exclusive of the disposition section where the electronic component is disposed, is a portion where an antenna and an IC are not provided. The predetermined portion may be set in one or plural positions of the label.

The bonding includes adhesion, welding, fusing, or pressurizing operations.

With the above arrangement, it is possible to protect the electronic component from stress of bending and/or stretching force, which is caused by elastic deformation of the article and acted on the IC tag. This improves tolerance and reliability of the IC tag.

The present invention may be arranged such that a tire is used as the article, and that the IC tag is attached to an inner surface of the tire.

The inner surface of the tire may be a surface of an inner liner, provided inside the tire.

According to the arrangement, it is possible to prevent breakage of an electronic component due to the elastic deformation of a tire, which is elastically deformed when the vehicle is in travel motion or the like.

The present invention may be arranged such that a protecting member, serving to protect the IC tag from a temperature load and a pressure load, is provided on a surface of the IC tag, opposite a surface of the IC tag which surface is attached to the article, and that the IC tag is attached to the article by applying pressure and heat to the IC tag from over the protecting member toward the article.

Examples of the protecting member include rubber materials such as a diene-based rubber, for example, a SBR (styrene-butadiene rubber), NBR (acrylonitrile-butadiene rubber), IIR (butyl rubber), ethylene propylene rubber, silicone rubber, butadiene, or polyisoprene (natural rubber).

According to the arrangement, it is possible to avoid (i) damage of the IC tag and (ii) the situation where a user cannot obtain data from the tire. Thus, the degree of users' satisfaction can be improved.

The present invention may be arranged such that a hole for attachment-use is created in a predetermined portion of a base member on which the electronic component is disposed, and that the protecting member is bonded to an inner surface of the tire by carrying out the step of applying pressure and heat in the hole for attachment-use, so as to bond the IC tag to the article.

The base member may include an unbonded member, which is not bonded to or not easily bonded to the inner liner even with application of heat and pressure. Examples of the unbonded member include a film made from PET (polyethylene terephthalate), and a member on which a surface treatment is applied using Teflon®.

According to the arrangement, it is possible to bond only part of the IC tag to the tire easily. This realizes the bonding with low cost.

The present invention may be directed to an article with an IC tag attached, wherein the IC tag performs wireless communication using an electronic component appropriately disposed, and the article is made from an elastically deformable material, the IC tag being disposed in a predetermined portion of the article, exclusive of a disposition section where the electronic component is disposed.

As such, an article with an IC tag attached is provided where the IC tag cannot be broken even when elastically deformed.

Further, the present invention may be directed to (i) an IC tag used in the method for attaching the IC tag or (ii) an IC tag used for the article with the IC tag attached.

This facilitates bonding of the IC tag to the article.

According to the present invention, it is possible to prevent breakage of an IC tag even when the IC tag is attached to an article made from an elastically deformable material, such as a tire used under extreme environment. This improves security of the article and reliability of the IC tag.

BEST MODE FOR CARRYING OUT THE INVENTION

Referring to drawings, the following describes one embodiment of the present invention.

Figure 1:
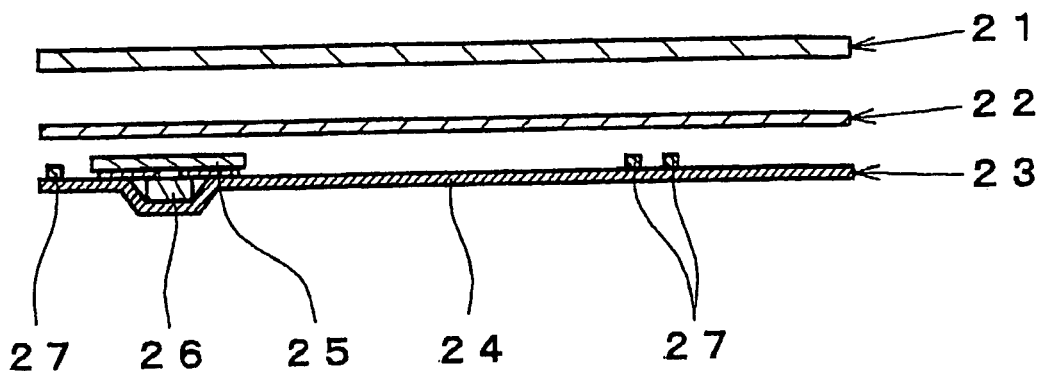
FIG. 1(a) is an explanatory view of a side cross section of a thin IC label.
FIG. 1(b) is an explanatory view of a side cross section of the thin IC label.
Figure 1:
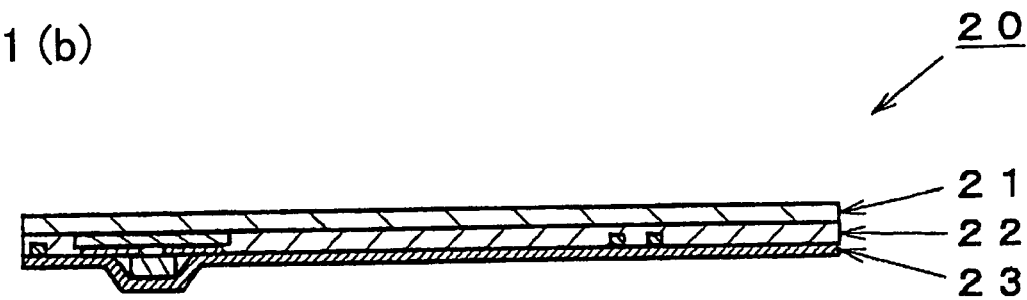
Figure 2:
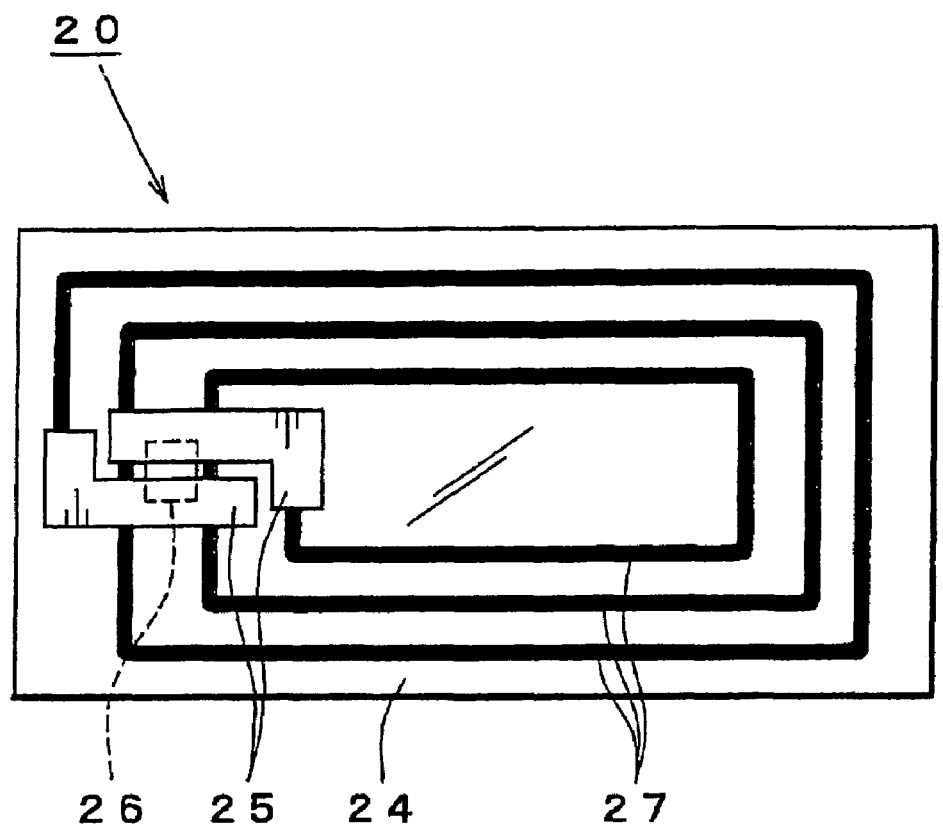
FIG. 2 is a plan view of the thin IC label.

First, a structure of a thin IC label 20 is described referring to FIGS. 1(a), 1(b), and FIG. 2. FIGS. 1(a) and 1(b) are explanatory views illustrating side cross sections of the thin IC label 20, and FIG. 2 is its plan view.

As shown in the side cross sectional view of FIG. 1(a), the thin IC label 20 is arranged such that a bonding adhesive 22 is applied directly to a film 21 by a calendar method or the like, and that the film 21 with the bonding adhesive 22 thus applied is bonded to an IC label base 23. Note that, instead of the calendar method, a lamination method may be used to laminate the film 21 on the thin IC label 20.

The film 21 is made from PET, and is formed to have a thickness of 12 μm.

The bonding adhesive 22 is formed by processing a silicon-based thermoplastic bonding adhesive to the form of a film. This bonding adhesive has a high temperature during remobilization, for example, 160° C. Note that, the bonding adhesive in the form of liquid may be applied to the film 21.

The IC label base 23 is arranged such that a substrate 25 is attached on a base 24, and that an IC 26 and an antenna 27 are mounted on the substrate 25. Note that, the antenna 27 may be formed by print wiring.

The film 21 and the IC label base 23, arranged as described above, are bonded using the bonding adhesive 22 as shown in FIG. 1(*b*), so that the thin IC label 20 is formed as shown in FIG. 2.

With the above structure, the thin IC label 20 is realized which is capable of performing non-contact data communication.

Note that, the thin IC label 20 performs data communication wirelessly with a query device using a communication frequency of 13.56 MHz. It is preferable that the thin IC label 20 obtain an electromotive force from an externally applied electromagnetic wave. However, the thin IC label 20 may include power means such as batteries appropriately.

Figure 3:
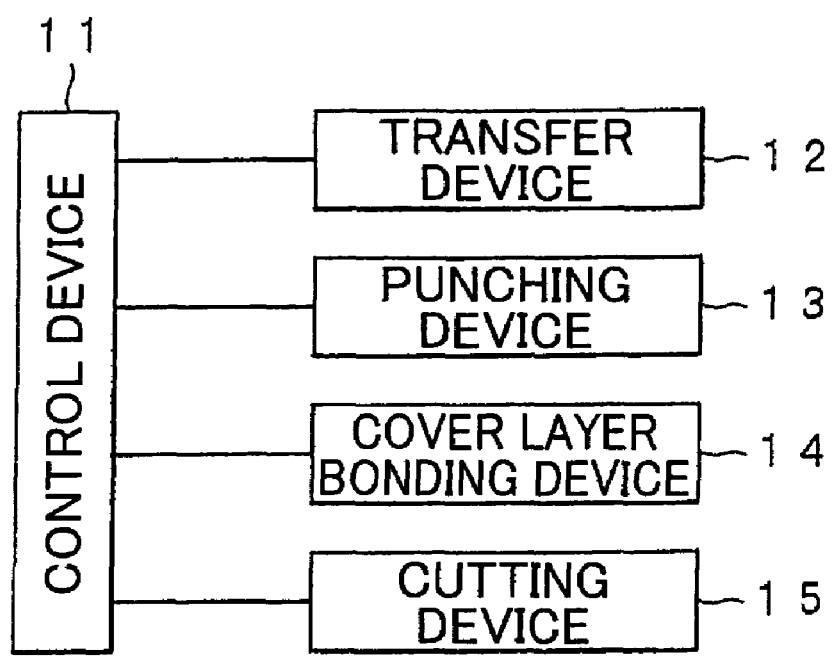
FIG. 3 is a block diagram illustrating a structure of an IC tag creating device.

Referring to FIG. 3, the following describes a structure of an IC tag creating device 1.

The IC tag creating device 1 includes a control device 11, a transfer device 12, a punching device 13, a cover layer bonding device 14, and a cutting device 15, which are connected to the control device 11.

The control device 11 includes a CPU, a ROM, and a RAM, and carries out control operations.

The transfer device 12 includes pressure rollers and drive means (such as a motor) appropriately, and transfers a board on which a plurality of the thin IC labels 20 are provided with an equal space from each other.

The punching device 13, driven by the drive means (such as a motor) appropriately, carries out operation for creating a predetermined hole in each of the thin IC label 20 on the board.

The cover layer bonding device 14 includes pressure rollers for applying heat using heating means. The pressure rollers are provided in an up and down direction so as to face each other. In the cover layer bonding device 14, the board and the cover layer with a bonding sheet interposed in between are passed through between the pressure rollers. When passing through between the rollers, the board, the cover layers, and the bonding sheet are heated and pressed by the pressure rollers at a predetermined temperature (e.g. 160° C.), so that the board and the cover layer are bonded with each other through the fused bonding sheet.

The cutting device 15 includes a cutter and drive means (such as a motor) appropriately. The cutting device 15 cuts the board on which a plurality of the thin IC labels 20 are provided, so that IC tags together with the cover layer bonded to the thin IC labels 20 are separated into individual IC tags.

With the above arrangement, IC tags can be created by (i) bonding the cover layer through the bonding sheet with the board having thereon a plurality of the thin IC labels 20, and (ii) creating a necessary hole in the cover layer, the bonding sheet, and the board, so as to separate the IC tags from each other.

Figure 4:
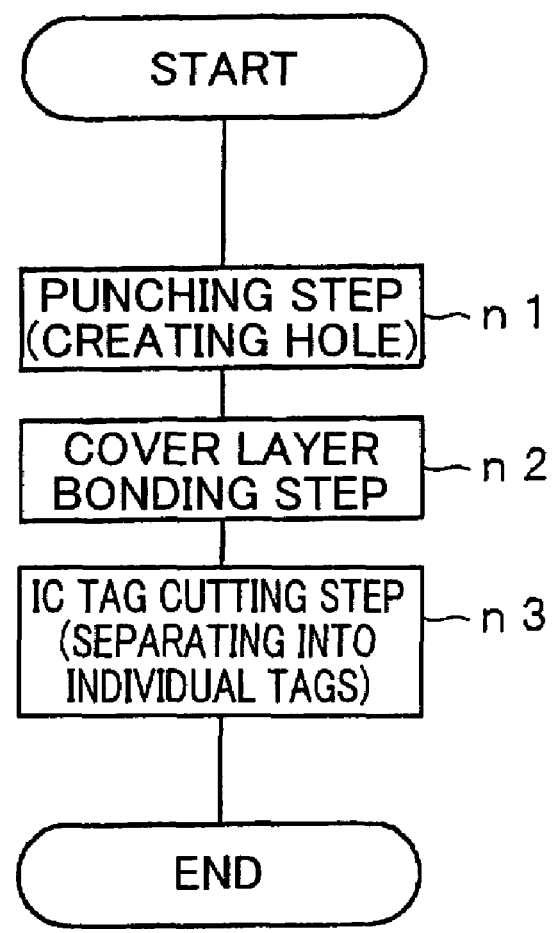
FIG. 4 is a flow chart showing operations of the IC tag creating device.

Referring to FIG. 4 showing a process flow chart, the following describes operations of the IC tag creating device 1 which creates an IC tag from a thin IC label 20.

Figure 5:
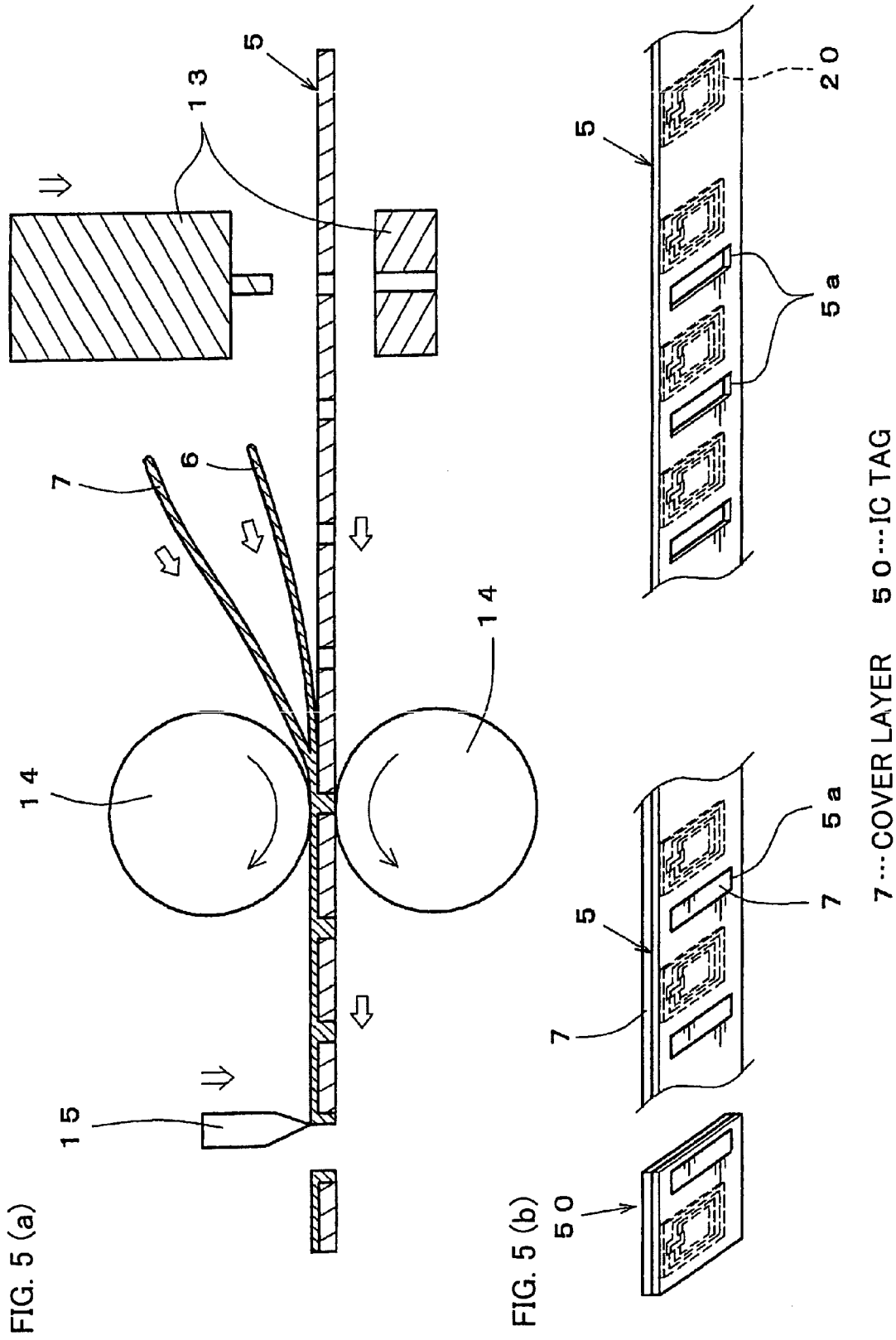
FIG. 5(a) is a explanatory view illustrating how the IC tag creating device creates an IC tag.
FIG. 5(b) is an explanatory view illustrating how the IC tag creating device creates an IC tag.

As shown in FIGS. 5(*a*) and 5(*b*), as a material to create an IC tag 50, a board 5 is prepared on which a plurality of thin IC labels 20 are provided.

FIG. 5(*a*) is an outside drawing showing a side view of the IC tag creating device 1. FIG. 5(*b*) is an outside drawing, seen from the bottom of the board 5. FIG. 5(*b*) shows perspective views of states in which IC tag 50*s* are created from thin IC labels 20.

In FIG. 5(*b*), the board 5 has thereon the thin IC labels 20 arranged with an equal space from each other in a transfer direction of the thin IC labels 20. However, the thin IC labels 20 are actually arranged in a plurality of lines in a lateral direction across the transfer direction.

The IC tag creating device 1 creates, using the punching device 13, a hole 5*a* in the board 5 transferred by the transfer device 12 (step n1). As shown in a side cross sectional view of FIG. 6(*a*), the hole 5*a* is formed outside the antenna 27 constituting the thin IC label 20, so as to become close to the antenna 27 with a predetermined distance from the antenna 27.

Regarding the size and shape of the hole 5*a*, as shown in FIG. 5(*b*), the hole 5*a* is formed in a rectangular having (i) a width being almost equal to the width of the antenna 27 and (ii) a length being not more than half the length of the antenna 27. Further, the hole 5*a* is formed to be parallel to the antenna 27 having a rectangular shape.

The IC tag creating device 1 carries out a step of bonding a cover layer. Then, the IC tag creating device 1 causes the cover layer bonding device 14 (FIGS. 5(*a*) and 5(*b*)) to heat and press the cover layer 7 onto the board 5 through the bonding sheet 6 by the lamination method (step n2).

As used herein, the cover layer 7 is made from a material such as, for example, an unvulcanized SBR (styrene-butadiene rubber), NBR (acrylonitrile-butadiene rubber), ethylene propylene rubber, silicone rubber, butadiene, or polyisoprene (natural rubber) or the like.

Further, a hot melt adhesive is used for the bonding sheet 6.

Figure 6:
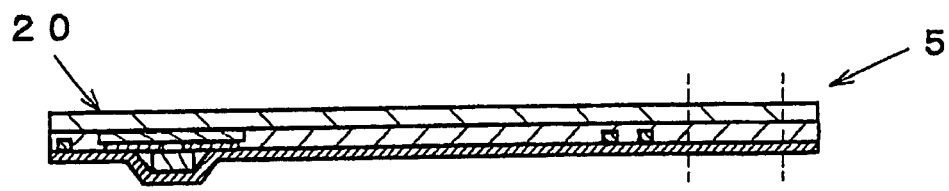
FIG. 6(a) is an explanatory view of a side cross section, showing how an IC tag is created.
FIG. 6(b) is an explanatory view of the side cross section, showing how the IC tag is created.
Figure 6:
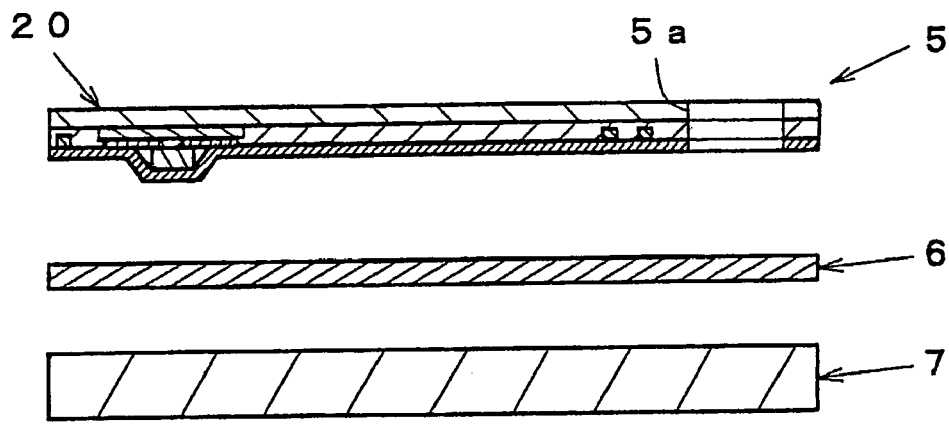
Figure 7:
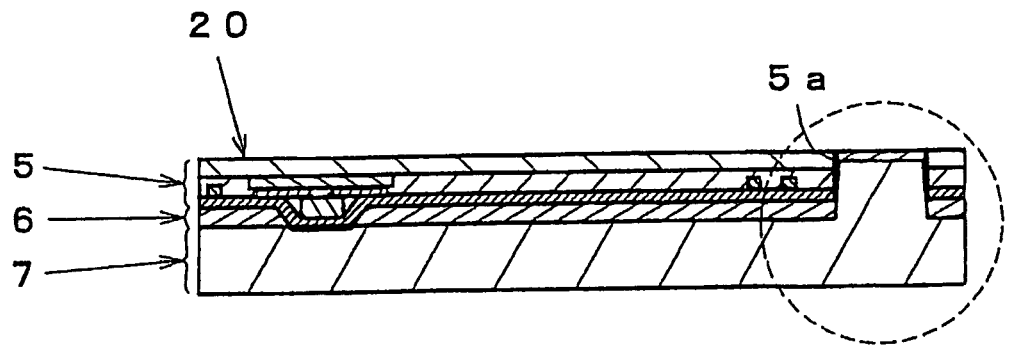
FIG. 7(a) is an explanatory view illustrating a cross section, showing how an IC tag is created.
FIG. 7(b) is an explanatory view illustrating a cross section, showing how the IC tag is created.
Figure 7:
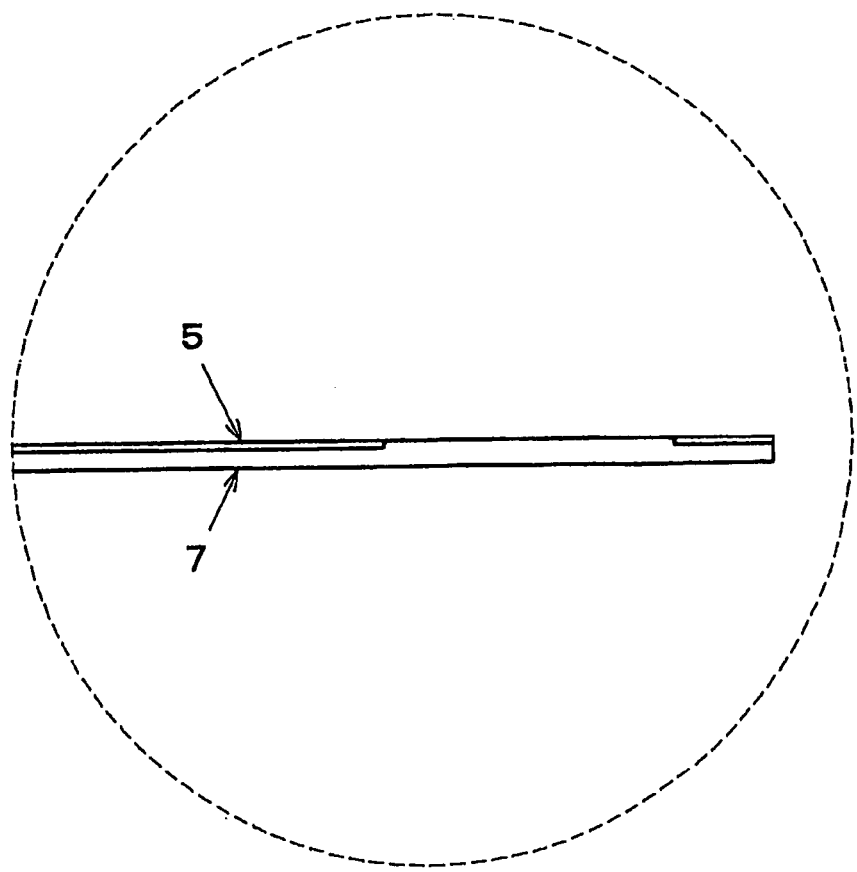

The bonding enables the board 5, the bonding sheet 6, and the cover layer 7, separated as shown in FIG. 6(*b*), to be integrated as shown in a side cross sectional view of FIG. 7(*a*).

In FIG. 7(*a*), the cover layer 7 is protruded so as to fit into the hole 5*a*. As shown in an enlarged view of FIG. 7(*b*) illustrating a side cross section of the cover layer 7, the thin IC label 20 is actually extremely thin. Thus, the cover layer 7 naturally fits into the hole 5*a* due to the pressure caused by the pressure rollers of the cover layer bonding device 14.

That is, since the cover layer 7, i.e., an unvulcanized rubber member having flexibility and plastic deformation capability, is formed to have a thickness of two to five times the thickness of the IC 26, the hole 5*a* is filled with the cover layer 7 having such deformation capability.

After the board 5 is bonded to the cover layer 7 in the foregoing manner, the IC tag creating device 1 cuts the board 5 thus bonded to the cover layer 7 using the cutter of the cutting device 15, and thereby IC tags 50 are separated into individual tags (step n3).

Here, the board 5 is cut at a position between the hole 5*a* and the antenna 27. Specifically, the cutting is made to the hole 5*a* in the width direction, near the hole 5*a*. As a result of the cutting operation, the cover layer 7 appears in the vicinity of one edge of the IC tag 50, when seen from a bottom surface of the IC tag 50 formed in a rectangular sheet.

With the above operations, the flat surface of the IC tag 50 is covered with the cover layer 7, and the cover layer 7 appears in part of the bottom surface of the IC tag 50. As such, the IC tag 50 is created that is suitably attached to a tire.

By repeating the foregoing steps (steps n1 through n3), it is possible to create the IC tag 50 continuously and automatically. This facilitates mass production of the IC tag 50.

Note that, in a case where, in the step n2, a hot melt adhesive is not used for the bonding sheet 6 and instead, a bonding adhesive is used that serves as an adhesive without being heated, the pressure rollers may be used without being heated.

Figure 8:
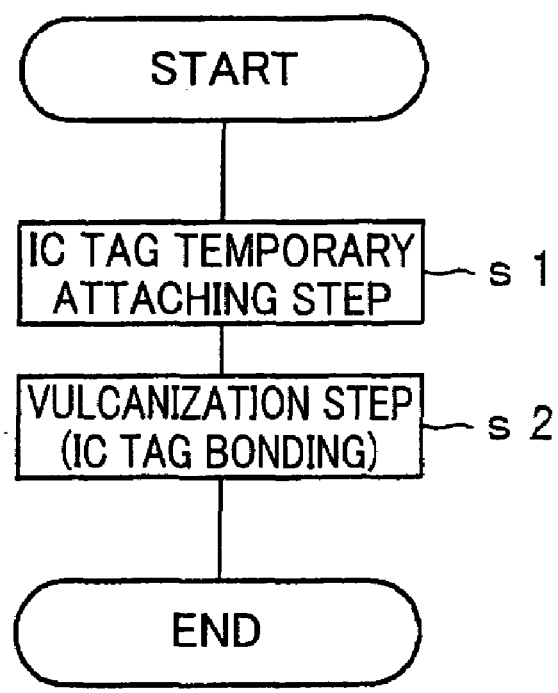
FIG. 8 is a process flow chart representing steps of attaching an IC tag to a tire.

Referring to FIG. 8, the following describes a method for attaching an IC tag 50 to a tire.

First, the IC tag 50 is temporarily attached to an unvulcanized tire (step s1). As shown in a side cross sectional view of FIG. 9(a), a surface of the IC tag 50, i.e., the side on which the thin IC label 20 is provided, is bonded to an inner liner 74 of a tire 70. Specifically, a protruding surface 8 (bonding section) of the cover layer 7 goes through the hole 5a of the thin IC label 20, and the IC tag 50 is bonded to the protruding surface 8 through the bonding sheet 6.

Figure 10:
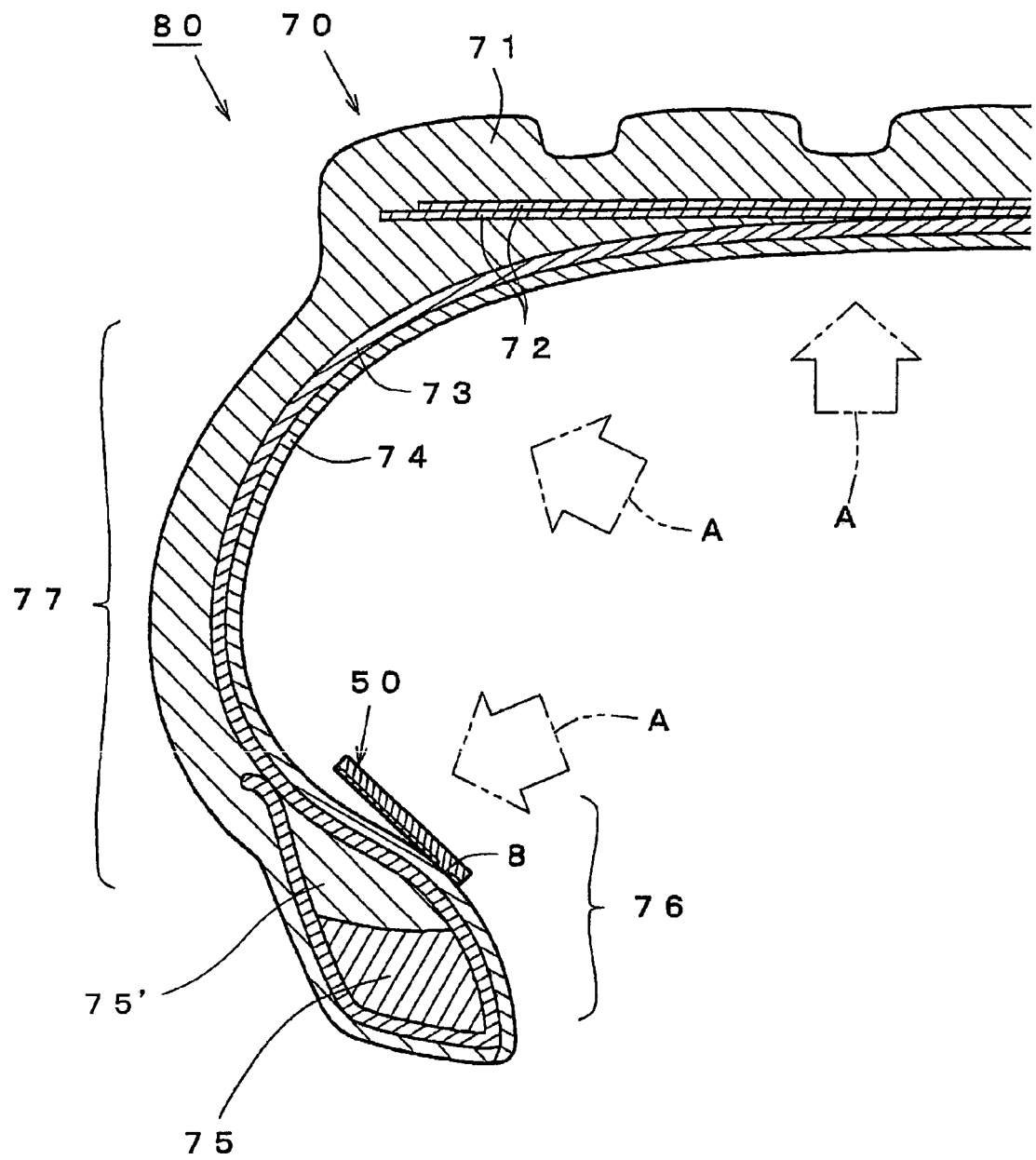
FIG. 10 is a cross sectional view illustrating a tire with an IC tag attached, where the tire is before vulcanization.

As shown in a cross sectional view of FIG. 10, the temporary attachment section (protruding surface 8) of the IC tag 50 is temporarily attached to the inner liner 74, i.e., an inner surface of the tire 70, in the vicinity of a bead section 76, so that the temporary attachment section of the IC tag 50 is located on the side of the center (the rotation axis) of the tire 70. That is, the side of the outer circumference of the tire 70, i.e., a tread section 71, is left opened.

Note that, the tire 70 includes the tread section 71, a belt 72, a carcass 73, the inner liner 74, a bead base 75, and the bead section 76.

The tread section 71 is an outer skin of a tire, and serves to protect the carcass 73 while preventing the tire from being abraded and/or scratched.

The belt 72 is a reinforcing belt, which is stretched in a circumference direction between the tread section 71 and the carcass 73 of the radial structure.

The carcass 73, i.e., a frame of a tire, is made from a fabric or steel wire. The carcass 73 endures heavy load, shock, and/or filling air pressure, so as to hold a structure of a tire.

The inner liner 74 is realized by attaching to the inner side of a tire a rubber layer, which is equivalent to a tube.

The bead base 75 enables a tire to be fixed to a limb.

The bead section 76, constituted by a bundle of high-carbon steel, holds both edges of a carcass code. This enables the tire 70 to be fixed to the limb.

The vicinity of the bead section 76 of the tire is constituted as described above, and is not deformed much when the tire is in use. Particularly, a portion where the protruding surface 8 is bonded to the IC tag 50 is constituted by the bead base 75 and a hard bead apex 75'. Thus, by attaching the IC tag 50 on this portion, it is possible to prevent the IC tag 50 from falling off. Further, since portion(s) having thereon electronic device(s) are not used for the bonding, it is possible to prevent (i) breakage of a contact point of the IC 26 and/or (ii) deformation of the substrate 25 on which the IC 26 is mounted. This prevents short circuit of a conductor circuit of the substrate 25.

Further, instead of using the bonding sheet 6 for the bonding, the temporary attachment may be made by applying to the protruding surface 8 a bonding adhesive which has a high adhesiveness to a rubber member, or by applying an adhesive to the film 21.

As such, a vulcanization step of forming the tire 70 is carried out, with the IC tag 50 temporarily attached to the tire 70 (step s2).

In the vulcanization step, as pointed by an arrow A indicated with a virtual line, a pressurizing step is carried out during which pressure is applied to the tire 70 from the inner side to the outer side of the tire 70 using a bladder (i.e., process for applying high pressure of, for example, about 25 atmosphere). At the same time, a heating step (i.e., process for applying heat at a high temperature of, for example, not less than 180° C.) is also carried out.

During the processes, the pressure applied using the bladder is converted by the cover layer 7 to a surface pressure that can be tolerated by a brittle material such as the IC 26. This prevents breakage of the IC 26 during the vulcanization step.

The vulcanization step enables an unvulcanized rubber member, used as the cover layer 7, to have an elasticity and a tolerance which are equivalent to those of a rubber member that is vulcanized to constitute the tire 70.

Figure 9:
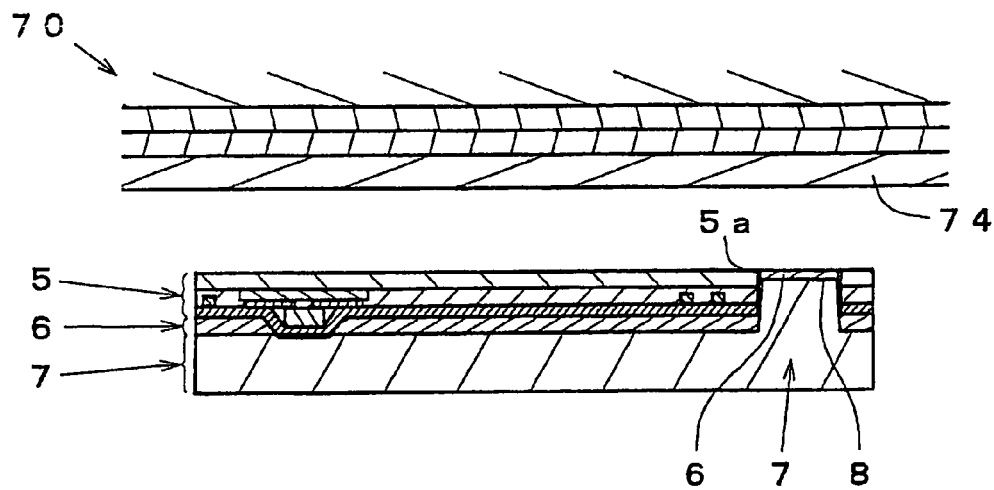
FIG. 9(a) is an explanatory view illustrating a side cross section, showing how an IC tag is attached to a tire.
FIG. 9(b) is an explanatory view illustrating a side cross section, showing how an IC tag is attached to a tire.
Figure 9:
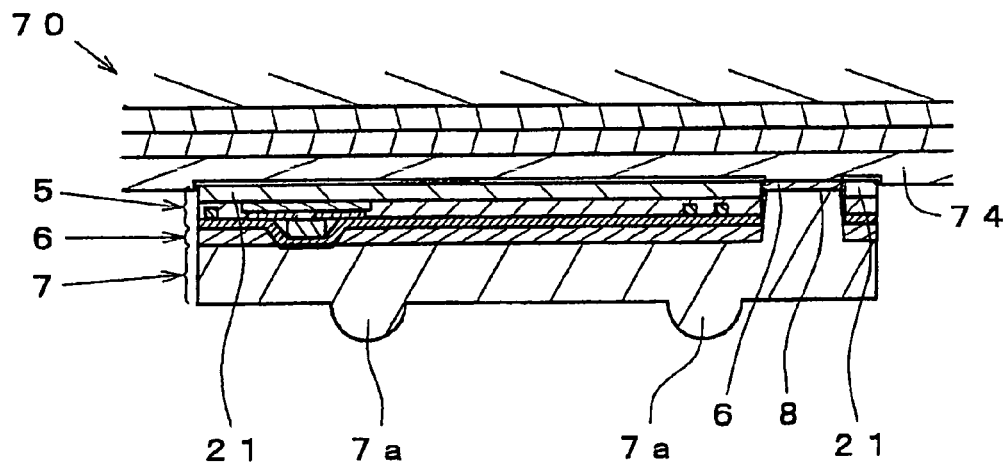

After the vulcanization step, the IC tag 50 is welded and securely fixed to the inner liner 74 of the tire 70 on the protruding surface 8, as shown in a side cross sectional view of FIG. 9(b).

The bladder used in the vulcanization step has bent lines on its surface. The bent lines are grooves serving to discharge the air. Thus, after the vulcanization step, protrusions 7a are formed as marks of the bent lines on the cover layer 7 of the IC tag 50.

Further, the inner liner 74 and the cover layer 7 are both unvulcanized rubber members having plastic deformation capability. Thus, a trace of the pressed IC tag 50 is remained on the inner liner 74, and the inner liner 74 and the cover layer 7 are welded and securely fixed to each other on the protruding surface 8 corresponding to the hole 5a.

The IC tag 50 also contacts the inner liner 74 at a portion other than the protruding surface 8. This portion is constituted by the film 21 which is neither bonded nor welded. Thus, this portion can be freely detached from the inner liner 74.

Figure 11:
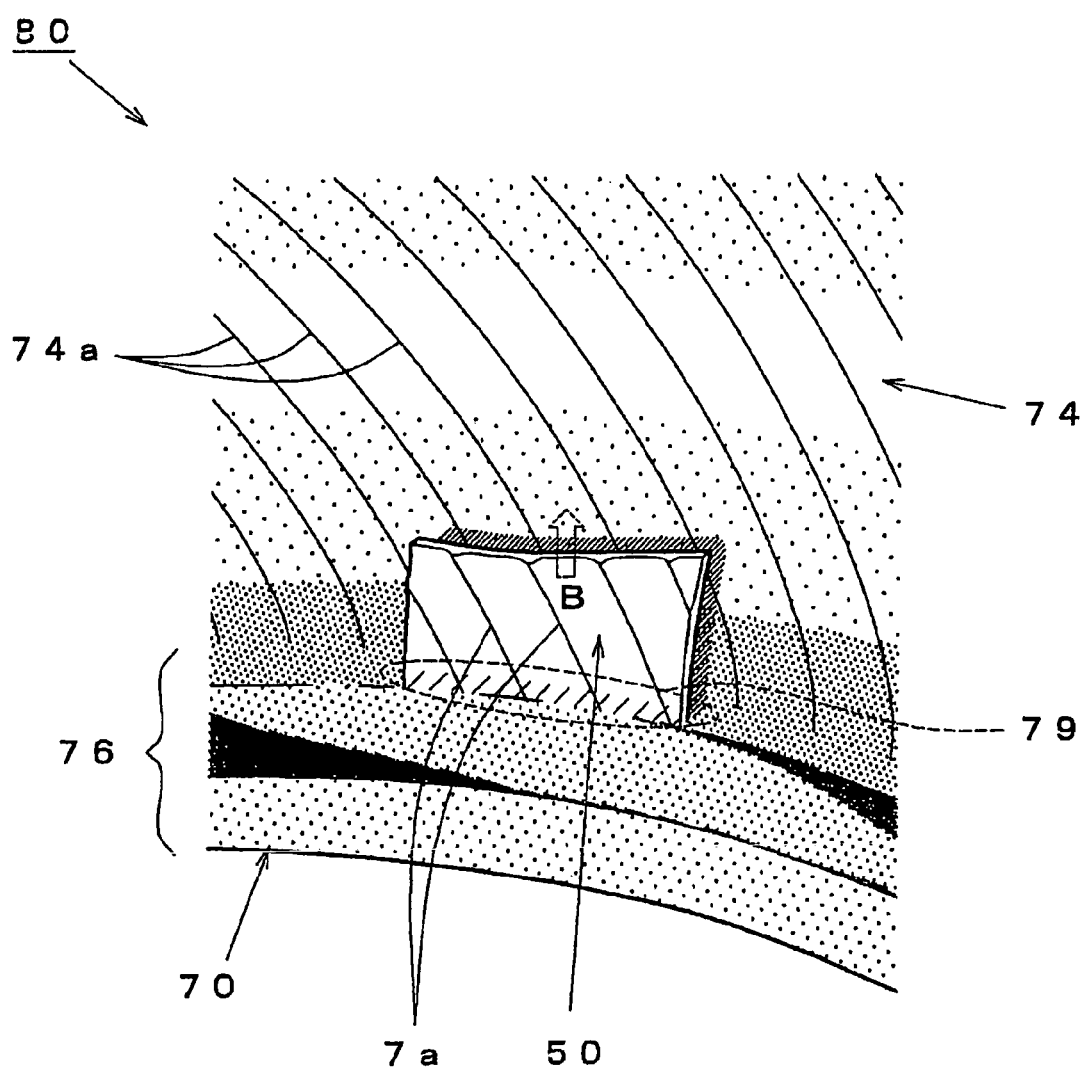
FIG. 11 is a perspective view illustrating a vulcanized tire with an IC tag welded.

With the foregoing method, it is possible to produce the tire 80 with an IC tag attached, by welding and fixing only part of the rectangular IC tag 50 to the inner liner 74 of the tire 70, as shown in a perspective view of FIG. 11 showing an inner side of a tire 80 with an IC tag attached.

Note that, there may be a case where the rubber flows when the cover layer 7 is vulcanized, causing the entire circumference of the IC tag 50 to be bonded. In this case, however, merely appearance is different from the perspective view of FIG. 11. Actually, the surface of the IC tag 50 and the surface of the inner liner 74 are not bonded with each other.

Thus, the thin IC label 20 itself is neither welded nor fixed to the tire 70, and only the protruding surface 8 of the cover layer 7, i.e., the protruding surface 8 exposed from the opening of the hole 5a of the thin IC label 20, is welded and fixed to the tire 70 on a contact portion of the tire 70, i.e., a bonding section 79.

In the inner liner 74, a bonding portion (welding portion) bonded to the IC tag 50 is in the vicinity of the bead section 76, which is not much deformed when the tire is in use. This reduces the effect of elastic deformation of the tire on the IC tag 50 as much as possible, when the tire is in use for travel motion.

Further, the IC tag 50 of the multi-layered structure has the film 21, i.e., a contacting surface by which the IC tag 50 contacts the inner liner 74. The bonding between (i) a PET member constituting the film 21 and (ii) the rubber member constituting the inner liner 74 is not good. Thus, the IC tag 50 is bonded to the inner liner 74 only on the protruding surface 8.

As such, since the IC 26 and the antenna 27 are spaced from the bonding portion, it is possible to prevent breakage of the IC 26 and the antenna 27 when the tire is elastically deformed. Particularly, by holding the IC 26 and the antenna 27 with a distance from the inner liner 74, it is possible to prevent breakage of the antenna 27 due to a stretching force of elastic deformation of the tire 70 in a case where the IC tag 50 is bonded to the entire inner liners 74. This enables the thin IC label 20 to operate stably for a long period.

Further, the IC tag 50 is bonded to a side surface of the tire 70 on the side of the rotation axis of the tire 70, and the circumference of the tire 70 is opened (free, released). This prevents the IC tag 50 from being removed when the tire 70 is mounted on a vehicle and is in use for travel operation.

When the vehicle is in travel motion, the centrifugal force acts in a direction indicated by an arrow B of FIG. 11. In this case, the IC tag 50 is fixed on the bonding portion, so as to hang down from the bonding portion when the centrifugal force acts on. This arrangement prevents the following situation. Specifically, if the IC tag 50 is bonded upside down, a free portion (unbonded portion) of the IC tag 50 may be curled up due to the centrifugal force so as to be removed forcedly. The above arrangement prevents such a situation, and thus the bonding-condition can be maintained without causing the IC tag 50 to withstand the centrifugal force.

Further, only requirement to obtain the IC tag 50 securely welded and fixed to the tire 70 is as follows. Specifically, the IC tag 50 is temporarily attached to the tire 70 when the tire is being manufactured, and then the rest of the process for manufacturing the tire 70 (i.e., vulcanization step) is performed. Thus, a reduction in the cost of production is realized.

Further, since a member constituting the bonding portion of the IC tag 50 is the same rubber member in quality as a rubber member constituting the inner liner 74, there is no affect of a difference in deformation capability between the thin IC label 20 and the tire 70 including the inner liner 74. This causes no defect such as cracking due to the difference in deformation capability between the materials, enabling to prevent breakage of the thin IC label 20 and the tire 70.

Further, the cover layer 7 is used as a buffer layer against the deformation in the vulcanization step, i.e., deformation which causes protrusions 74a to be formed as marks of the bent lines (FIG. 11) by the grooves, formed on the bladder, for discharging the air. As such, the cover layer 7 prevents deformation of the thin IC label 20.

Further, IC tag 50 is bonded to the tire 70, neither on a sidewall section 77 where the tire is severely deformed in travel motion, nor on a limb-contact surface which comes in contact with the limb. This prevents breakage of the IC tag 50.

Figure 12:
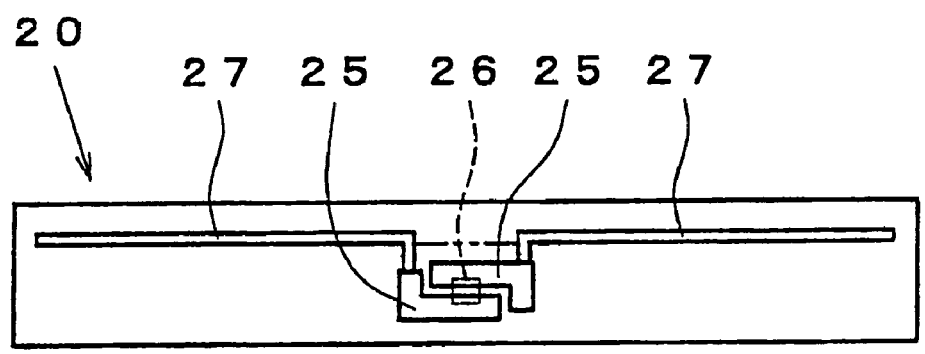
FIG. 12 is a plan view illustrating another thin IC label.

Note that, as the thin IC label 20, a non-contact thin IC label 20 using a UHF band (850 MHz to 960 MHz) as communication frequency may be used as shown in a plan view of FIG. 12.

It is possible also in this case that the tire 80 with an IC tag attached is manufactured with low cost, and that breakage of both the thin IC label 20 and the tire 70 are prevented.

Further, the bonding adhesive 22 for bonding the film 21 to the IC label base 23 may be made from a material having thermosetting properties such as, for example, an epoxy-based thermosetting adhesive in which a UV hardening agent is mixed.

This enables, after the film 21 is temporarily bonded to the IC label base 23, the thin IC label 20 to be completely hardened through a high temperature process carried out in the process of vulcanizing the tire 70 (step s2).

Further, the bonding operation in the step n2 for bonding the film 21 to the IC label base 23 may be performed by applying the cover layer 7 directly to the thin IC label 20 using the calendar method or the like, instead of the lamination method.

Further, in the cutting operation of the step n3, the cutting may be made at the center of the hole 5a in the width direction, so as to separate IC tags 50 individually. In this case, cutting the board 5 at the center of the hole 5a causes the cover layer 7 to appear in both sides of the board 5. Thus, by cutting one of the exposed parts of the cover layer 7, the cover layer 7 may appear only in one portion of the cover layer 7.

This enables one surface, i.e., one flange portion, of the IC tag 50 to be bonded to the tire 70.

Further, the IC tag 50 and the inner liner 74 may be bonded not only on one bonding portion, but also on plural bonding portions. In this case, the bonding portions may be set in areas where the electronic components such as the substrate 25, the IC 26, and the antenna 27 are not provided.

In this way, it is possible to set the bonding areas appropriately, according to a size ratio and difference in elastic deformation between the tire 70 and the IC tag 50.

Figure 13:
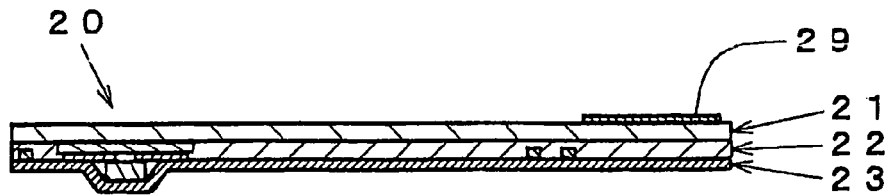
FIG. 13(a) is an explanatory view of a side cross section, showing another method for attaching an IC tag to a tire.
FIG. 13(b) is an explanatory view of a side cross section, showing the another method for attaching an IC tag to a tire.
FIG. 13(c) is an explanatory view of a side cross section, showing the another method for attaching an IC tag to a tire.
Figure 13:
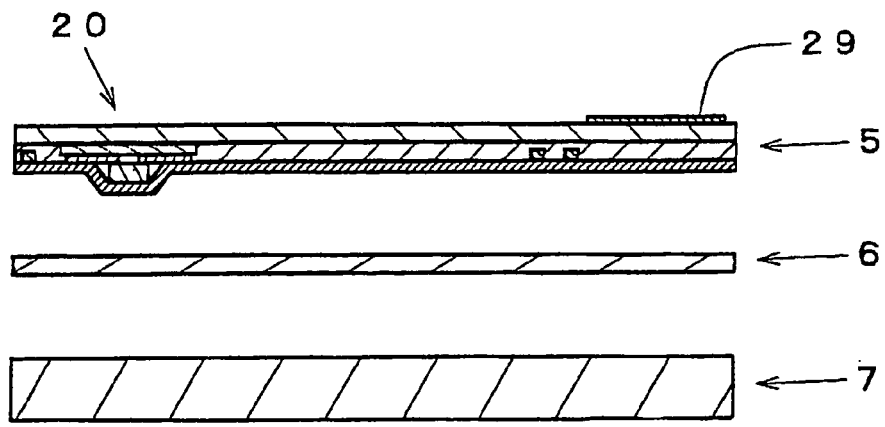
Figure 13:
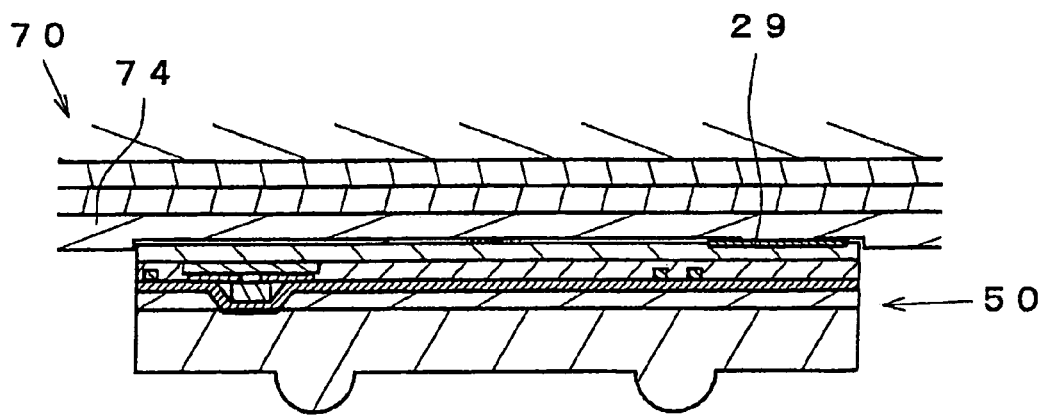
Figure 14:
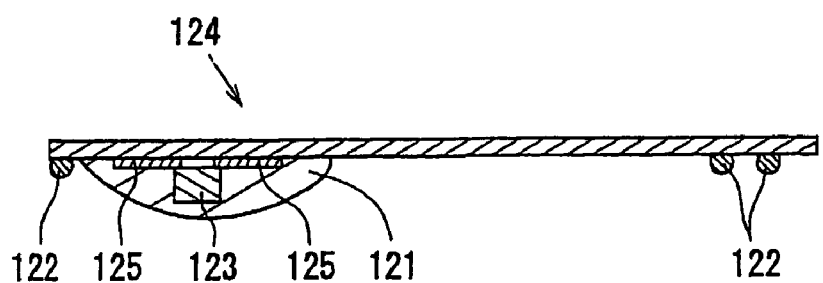
FIG. 14(a) is an explanatory view of a side cross section, showing a conventional example of attaching an IC tag to a tire.
FIG. 14(b) is an explanatory view of a side cross section, showing the conventional example of attaching an IC tag to a tire.
Figure 14:
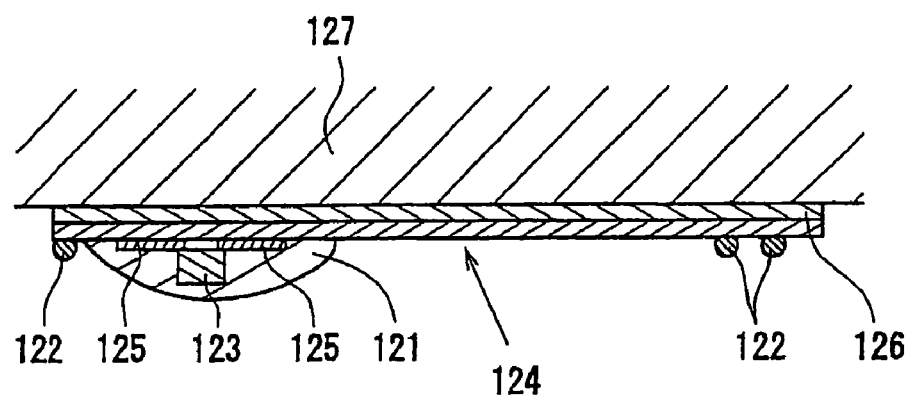

Further, instead of creating the hole 5a in the board 5 including the thin IC label 20, part of the film 21 of the thin IC label 20 may be bonded to the inner liner 74 as shown in an explanatory view of FIGS. 13(a) to 13(c).

In this case, as shown in FIG. 13(a), an adhesive 29 may be applied on part of the surface of the film 21 of the thin IC label 20. The adhesive 29 has good bonding properties with a rubber member, i.e., the inner liner 74 of the tire 70, and is applied by a silk screen print method or the like.

Then, in the step n2 described in the embodiment, the cover layer 7 is bonded through the bonding sheet 6 to the surface of the thin IC label 20, on which surface the base 24 is provided, as shown in FIG. 13(b).

In the step s2 described in the embodiment, the IC tag 50 is bonded to the inner liner 74 of the tire 70 using the adhesive 29, as shown in FIG. 13(c).

This eliminates the need to create the hole 5a in the board 5, enabling to easily bond the IC tag 50 to the inner liner 74 using the adhesive 29.

In relation to the embodiment, a predetermined component of the present invention corresponds to the protruding surface 8 or the portion where the adhesive 29 is applied, which is described in the embodiment. Similarly, components of the present invention and those described in the embodiment have the following relationships in this order: a protecting member corresponds to the cover layer 7; a base member corresponds to the base 24; electronic components correspond to the substrate 25, the IC 26, and the antenna 27; an article corresponds to the tire 70; an article with an IC tag attached corresponds to the tire 80 with an IC tag attached; an elastically deformable material corresponds to a SBR, NBR, ethylene propylene rubber, silicone rubber, butadiene, or polyisoprene; and bonding corresponds to welding or bonding performed in the step s2. Regardless of the above relationships, the present invention is not limited to the arrangement of the embodiment, and may be varied in many ways.

INDUSTRIAL APPLICABILITY

The present invention is applied to use of an IC tag, for example, an IC tag attached to an article such as a tire, made from an elastically deformable material.

The invention claimed is:

1. An integrated circuit tag, which performs wireless communication using a disposed electronic component, and which is to be attached to an article made from an elastically deformable material,
said integrated circuit tag, comprising:
a disposition section where the electronic component is disposed;
a bonding section to be bonded to the article, exclusive of the disposition section;

a board including: the electronic component; and a base member having thereon the electronic component disposed and serving as the disposition section;

a bonding sheet bonded to said board so as to cover the base member; and a cover layer bonded to said bonding sheet and serving as a protecting member;

said cover layer having a protruding surface, serving as the bonding section, which goes through said bonding sheet and said board, so as to be exposed in a portion of said board, exclusive of the disposition section where the electronic component is disposed.

2. The integrated circuit tag according to claim 1, wherein said cover layer includes an unvulcanized material essentially consisting of at least one kind of material selected from a natural rubber and a diene-based rubber.

3. The integrated circuit tag according to claim 2, wherein said cover layer includes an unvulcanized material essentially consisting of at least one kind of material selected from styrene-butadiene rubber, acrylonitrile-butadiene rubber, ethylene propylene rubber, silicone rubber, butadiene, and polyisoprene.

4. A method for attaching an integrated circuit tag, comprising the step of attaching an integrated circuit tag to an article made from an elastically deformable material, the integrated circuit tag performing wireless communication using an electronic component appropriately disposed, the integrated circuit tag being attached to a predetermined portion of the article, exclusive of a disposition section where the electronic component is disposed, said integrated circuit tag, comprising:

a disposition section where the electronic component is disposed;

a bonding section to be bonded to the article, exclusive of the disposition section;

a board including: the electronic component; and a base member having thereon the electronic component disposed and serving as the disposition section;

a bonding sheet bonded to said board so as to cover the base member; and a cover layer bonded to said bonding sheet and serving as a protecting member;

said cover layer having a protruding surface, serving as the bonding section, which goes though said bonding sheet and said board, so as to be exposed in a portion of said board, exclusive of the disposition section where the electronic component is disposed.

5. The method for attaching an integrated circuit tag according to claim 4, wherein:

a tire is used as the article, and the integrated circuit tag is attached to an inner surface of the tire.

6. The method for attaching an integrated circuit tag according to claim 4, wherein a protecting member, serving to protect the integrated circuit tag from a temperature load and a pressure load, is provided on a surface of the integrated circuit tag, opposite a surface of the integrated circuit tag which surface is attached to the article, said method, comprising the step of:

applying pressure and heat to the integrated circuit tag from over the protecting member toward the article, so as to attach the integrated circuit tag to the article.

7. An integrated circuit tag, used in the method for attaching an integrated circuit tag recited in claim 4.

8. A method for attaching an integrated circuit tag, comprising the step of attaching an integrated circuit tag to an article made from an elastically deformable material, the integrated circuit tag performing wireless communication using an electronic component appropriately disposed, the integrated circuit tag being attached to a predetermined portion of the article, exclusive of a disposition section where the electronic component is disposed, wherein a protecting member, serving to protect the integrated circuit tag from a temperature load and a pressure load, is provided on a surface of the integrated circuit tag, opposite a surface of the integrated circuit tag which surface is attached to the article, said method comprising the steps of:

applying pressure and heat to the integrated circuit tag from over the protecting member toward the article, so as to attach the integrated circuit tag to the article;

creating a hole in a predetermined portion of a base member on which the electronic component is disposed; and bonding an inner surface of the article to the protecting member by carrying out the step of applying pressure and heat in the hole for attachment, so as to bond the integrated circuit tag to the article.

9. An article with an integrated circuit tag attached, wherein the integrated circuit tag performs wireless communication using an electronic component appropriately disposed and the article is made from an elastically deformable material, the integrated circuit tag being disposed in a predetermined portion of the article, exclusive of a disposition section where the electronic component is disposed, said integrated circuit tag, comprising:

a disposition section where the electronic component is disposed;

a bonding section to be bonded to the article, exclusive of the disposition section;

a board including: the electronic component; and a base member having thereon the electronic component disposed and serving as the disposition section;

a bonding sheet bonded to said board so as to cover the base member; and a cover layer bonded to said bonding sheet and serving as a protecting member;

said cover layer having a protruding surface, serving as the bonding section, which goes through said bonding sheet and said board, so as to be exposed in a portion of said board, exclusive of the disposition section where the electronic component is disposed.

10. An integrated circuit tag, used for an article with an integrated circuit tag attached recited in claim 9.

* * * * *

UNITED STATES PATENT AND TRADEMARK OFFICE
CERTIFICATE OF CORRECTION

| | | |
|---|---|---|
| PATENT NO. | : 7,616,121 B2 | Page 1 of 1 |
| APPLICATION NO. | : 11/587308 | |
| DATED | : November 10, 2009 | |
| INVENTOR(S) | : Kawai et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 450 days.

Signed and Sealed this

Nineteenth Day of October, 2010

David J. Kappos
*Director of the United States Patent and Trademark Office*